United States Patent [19]

Elles et al.

[11] 4,361,261
[45] Nov. 30, 1982

[54] APPARATUS FOR WIRE BONDING

[75] Inventors: Richard J. Elles, Philadelphia; Frederick W. Kulicke, Jr.; Moshe E. Sade, both of Horsham; Albert Soffa, Wynnewood, all of Pa.

[73] Assignee: Kulicke & Soffa Industries, Inc., Horsham, Pa.

[21] Appl. No.: 178,368

[22] Filed: Aug. 15, 1980

Related U.S. Application Data

[62] Division of Ser. No. 963,167, Nov. 22, 1978, Pat. No. 4,239,144.

[51] Int. Cl.$^3$ .................... H01L 21/607; B23K 37/02
[52] U.S. Cl. .................................... 228/103; 29/407; 228/179
[58] Field of Search ............... 228/103, 179, 4.5, 102; 33/169 C, 172 D, 185 R; 29/406, 407

[56] References Cited

U.S. PATENT DOCUMENTS

| | | | |
|---|---|---|---|
| 3,044,322 | 7/1962 | George | 33/185 X |
| 3,167,866 | 2/1965 | Steineman | 33/172 D |
| 3,960,309 | 6/1976 | Hazel | 228/4.5 X |
| 3,997,100 | 12/1976 | Hofmeister | 228/179 |

*Primary Examiner*—Kenneth J. Ramsey
*Attorney, Agent, or Firm*—Edward M. Farrell

[57] ABSTRACT

A wire bonding machine for wedge bonding fine wires to semiconductor devices is provided with a rotating bonding head which is mounted on a fixed machine frame and having a X-Y table mounted on the fixed machine frame opposite a vertically movable bonding tool mounted on the rotating bonding head. The bonding head is provided with means for articulating the bonding tool in a vertical direction and in a rotational direction. The rotational movement of the novel bonding head does not impart vertical movement to the bonding tool.

3 Claims, 17 Drawing Figures

APPARATUS FOR WIRE BONDING

This application is a division of application Ser. No. 963,167, filed Nov. 22, 1978, now U.S. Pat. No. 4,239,144.

BACKGROUND OF THE INVENTION

I. Field of the Invention

The present invention relates to an automatic wire bonder and more particularly to a bonding head for an automatic wire bonder of the type employed for aluminum wire wedge bonding.

II. Description of the Prior Art

Automatic wire bonders have been made which operate similar to numerical controlled machine tools. A semiconductor device to be wire bonded is placed in a working position on the wire bonding machine and a plurality of wires, each having first and second bond positions, are attached to the semiconductor device and/or the supporting substrate. A program is generated by a computer cooperating with servo devices as the first semiconductor is manually wire bonded. The program of the first bonding pattern is recorded and then may be employed to duplicate the same routine of wire bonds on other semiconductor devices. The process of generating the program is referred to as the learning mode or the teaching mode, implying that subsequent devices are bonded with the program which is now in a working mode. It is well known in the electronic data processing field that such programs may be stored in several types of memories and rapidly recalled and utilized through programmable electronic computing machines.

Prior art automatic wire bonders have employed an X-Y table which supported a work holder where the X-Y table was in turn supported on a theta or rotational drive table. The Z motion for the bonding tool was incorporated in a bonding tool actuating mechanism which was mounted on the machine frame opposite and apart from the work holder and the X-Y table. When the X-Y table and the drive motors are mounted atop the theta axis, the theta drive must be very heavy and require high torques to move the X-Y table and the work piece. Such an arrangement is inherently slow because of these large inertias; further, it comprises the design of the X-Y table.

Automatic wire bonders have been proposed which incorporate the mechanism for X-Y movement and rotational movement into a support mechanism for the bonding head. Here again when the theta drive is mounted on the X-Y motion mechanism there is a large amount of mass to be moved by the X-Y servos. In this type of arrangement the added mass of the bonding head is also moved by the X-Y servos and the theta or rotational bonding head drive motors. In this type device, the Z motion may be incorporated in the base for supporting the substrate or semiconductor device to avoid the necessity of the Z drive motor having to move the X-Y and theta mechanisms as well as the bonding head.

It is desirable to eliminate as much of the mass of the moving parts as possible. It is also desirable to reduce the setting time of vibrations so that the Z drive and theta drive servo mechanisms can drive the bonding tool to a bonding position as fast as the X-Y table can position the substrate opposite the bonding tool.

Heretofore, it was known that is was desirable to locate the working face of the bonding tool at the center of rotation of a rotatable bonding head in order to accurately position automatically the working face of the bonding tool over a desired bonding electrode or bonding pad. Heretofore automatic wire bonding machines having rotatable bonding heads having been plagued with the problem of accurately placing the working face of the bonding tool at the center of rotation of the rotatable bonding head. Prior art rotatable head wedge bonding machines have been provided with manual adjustable features to position the working face of the bonding tool at the center of rotation of the bonding head. It has been found that it is almost impossible to make such manual adjustments accurately. Further, it has been found that each time a bonding tool is replaced in the bonding tool holder the working face of the bonding tool is not repositioned in the exact position of the former tool. Thus, it has been found in the prior art that each time a bonding tool is replaced in the bonding tool holder that readjustment of the center of rotation of the working face of the bonding tool is required. Furthermore, it has been found that numerous prior art devices are not sufficiently accurate to maintain their center of rotation of the bonding tool at the same location.

It would be extremely desirable to provide an inexpensive, reliable, fast acting automatic wire bonding machine which would accurately locate the first and second bond positions after being taught or programmed where the location of the bonding pads are relative to the working face of the bonding tool.

SUMMARY OF THE INVENTION

It is a primary object of the present invention to provide a high speed fine wire wedge bonding device having a rotating bonding head.

It is another object of the present invention to provide a low mass bonding head for a fine wire wedge bonding machine.

It is another object of the present invention to provide a high speed wedge bonding machine having a rotatable bonding head mounted on a fixed machine frame and driven by a servo motor mounted on the fixed frame.

It is a general object of the present invention to provide a rotatable bonding head which is movable by a servo motor in the manner which does not impart Z motion to the bonding tool.

It is another general object of the present invention to provide a method and apparatus for accurately positioning the working face of a replaceable bonding tool at the true center of rotation of the bonding head during a bonding operation even though the working face of the bonding tool is not physically aligned at the true center of rotation of the bonding head.

It is a general object of the present invention to provide a plurality of simple adjustable limit switches for limiting the rotational movement and vertical movement of the bonding tool to avoid damaging the semiconductor device or the accuracy of the moving parts of the bonding machine.

In accordance with these and other objects of the present invention to be described in detail hereinafter, there is provided a wire bonding machine having a rotatable bonding head which is mounted on a hollow cylindrical sleeve rotatably mounted on a fixed frame. A theta drive motor mounted on the fixed frame is adapted to rotate the hollow cylindrical sleeve and the bonding head mounted thereon. The hollow cylindrical sleeve supports a pivotable bonding tool holder which comprises means for mounting a bonding tool at the center of rotation of the hollow cylindrical sleeve. A Z drive motor is mounted on the fixed frame for actuating vertical movement of the bonding tool and is coupled to the bonding tool holder through a vertically movable universal joint which is mounted on the fixed machine frame in axial alignment with the center of rotation of the hollow cylindrical sleeve so that rotational movement of the hollow cylindrical sleeve does not impart vertical movement to the bonding tool.

DESCRIPTION OF THE PREFERRED EMBODIMENTS

Figure 1:
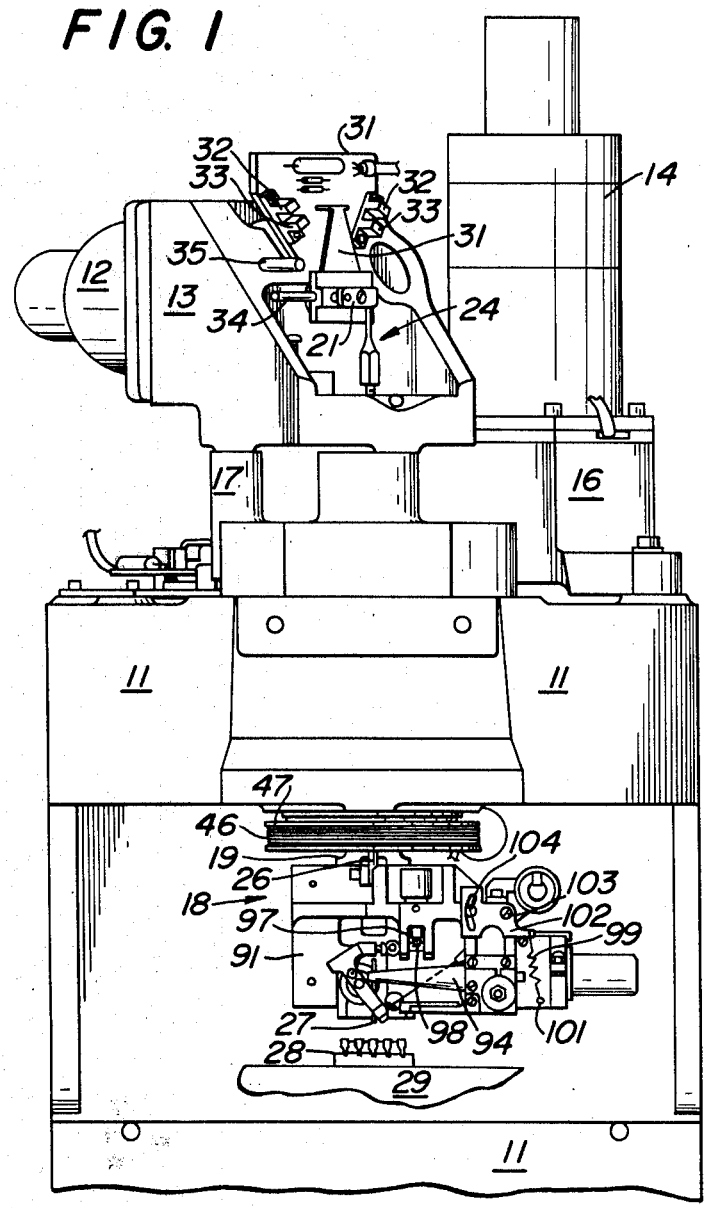
FIG. 1 is a front elevation of a preferred embodiment wedge bonding machine showing a rotatable bonding head mechanism which supports a pivotable bonding tool holder having a bonding tool mounted therein at the center of rotation of the bonding head.
Figure 2:
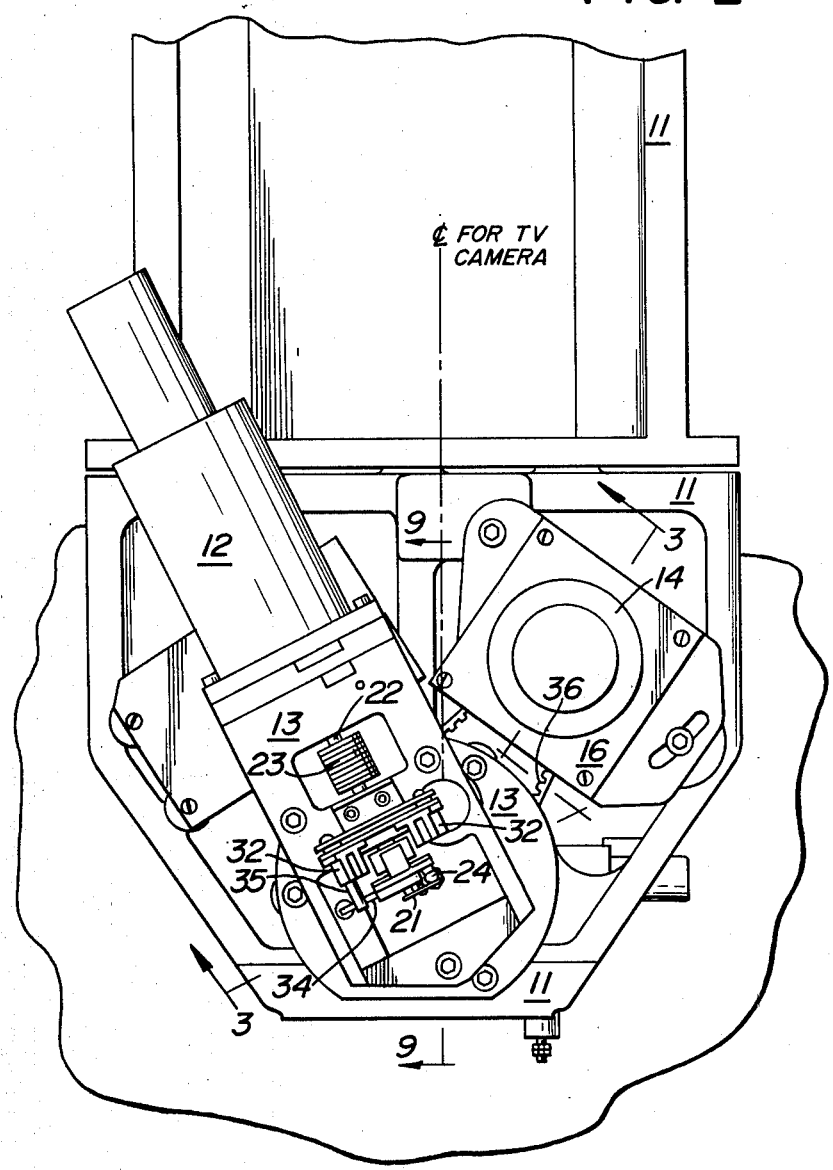
FIG. 2 is an enlarged top plan view of the wedge bonding machine of FIG. 1 showing the location of the theta drive motor and the Z drive motor.
Figure 3:
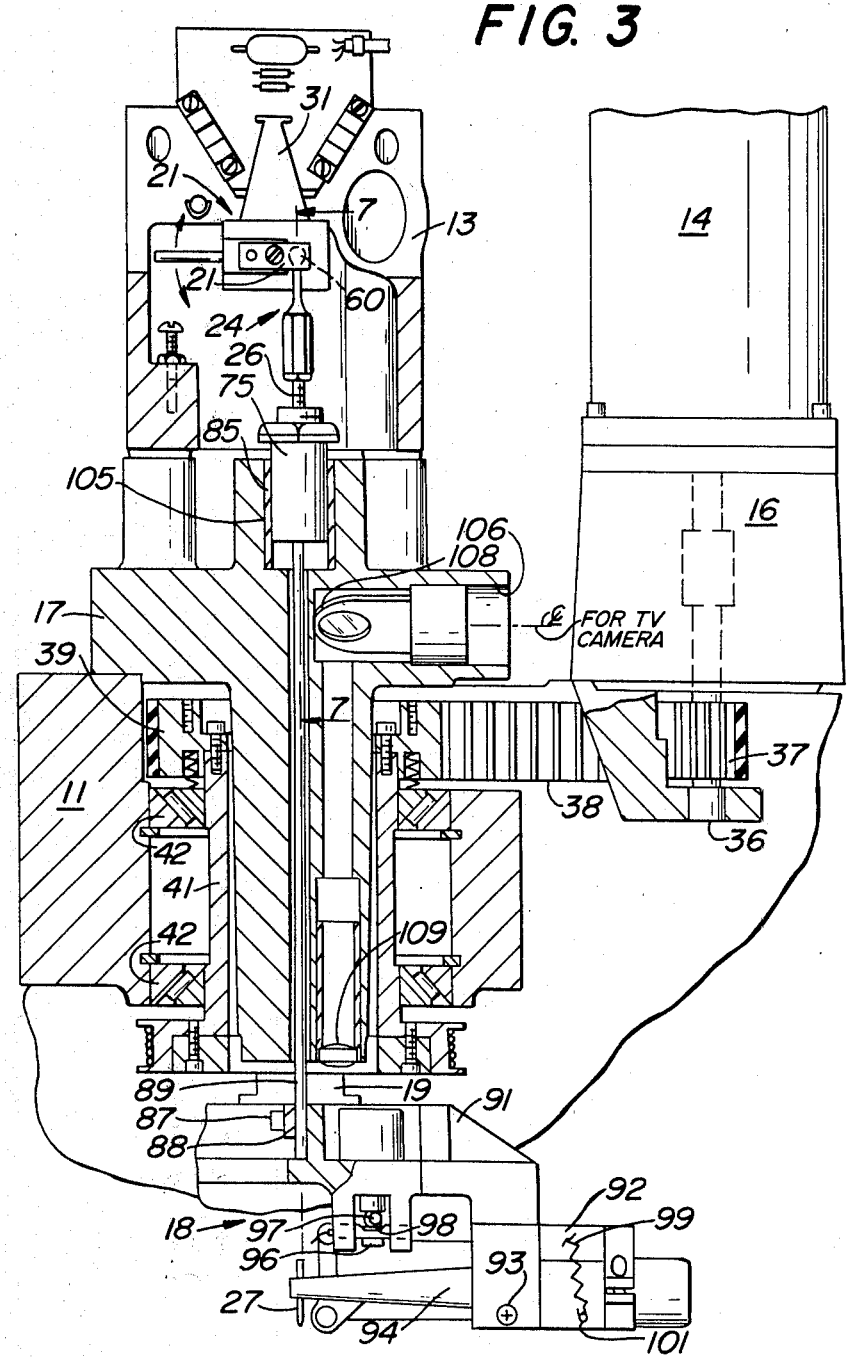
FIG. 3 is an enlarged section in elevation taken at lines 3—3 of FIG. 2 showing the details of the Z motion drives and theta motion drives.

Referring now to FIGS. 1 to 3 which show a front and top view of the fine wire wedge bonding machine. The fixed machine base 11 preferably comprises a plurality of machine castings for supporting the components to be described. The Z drive motor 12 is mounted on a Z drive mounting bracket 13 which attaches to the fixed machine base 11. The theta or rotational drive motor 14 is mounted on a theta motor mounting bracket 16 which is fixed to the machine base 11. The fixed machine frame comprises a separate optical support bracket 17.

The Z drive motor 12 is adapted to move the bonding head assembly 18 in the Z direction or vertical axis and for this purpose is mounted on a slide 19 which is connected to a rotatable hollow cylindrical sleeve to be described hereinafter. The Z motor is provided with an eccentric crank 21 which is actuated by the Z motor shaft 22 acting through a coupler 23. Rotational movement of shaft 22 imparts arcuate movement to eccentric crank 21 which receives the ball end of coupling means 24 therein. Vertical movement of coupling means 24 imparts vertical movement to the top end 26 of the connecting rod which is connected to the bonding head 18. Vertical movement of the bonding head 18 imparts vertical movement to the bonding tool 27 which is mounted at the center of rotation of the bonding head 18 and is positioned opposite an electrode (not shown) on the semiconductor device mounted on substrate 28 shown mounted on X-Y table 29.

It will be understood that servo motors 12 and 14 are provided with positioning indicating devices which permit them to be moved to desired rotational positions under the control of electronic logic such as a computer. The logic for locating the rotational position of these motors is well known in the prior art and does not require explanation herein to describe the present invention.

The eccentric crank 21 is connected to a limit switch arm having a shutter 31 which is provided with a blade that is imposed between the emitter 32 and photodetector 33 which comprise the limit switches for limiting the movement of the eccentric crank 21. The eccentric crank 21 is further provided with a stop limit pin 34 which is engageable with a limit pin 35 projecting from Z motor bracket 13. The positive limit stop 34, 35 prevents the bonding head 18 from moving downward too far so as to destroy the work pieces on substrate 28 or to damage the bonding head 18.

Figure 4:
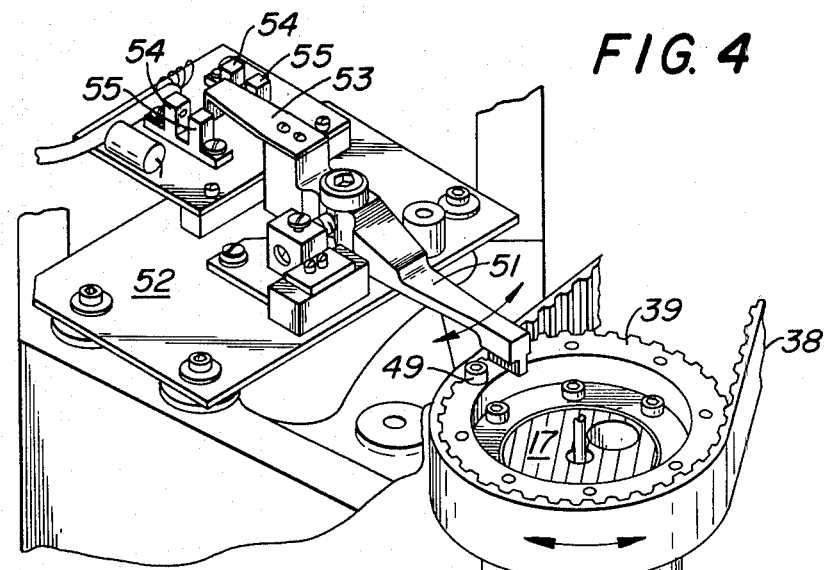
FIG. 4 is an enlarged partial isometric drawing showing the limit switches associated with the theta drive mechanism.
Figure 5:
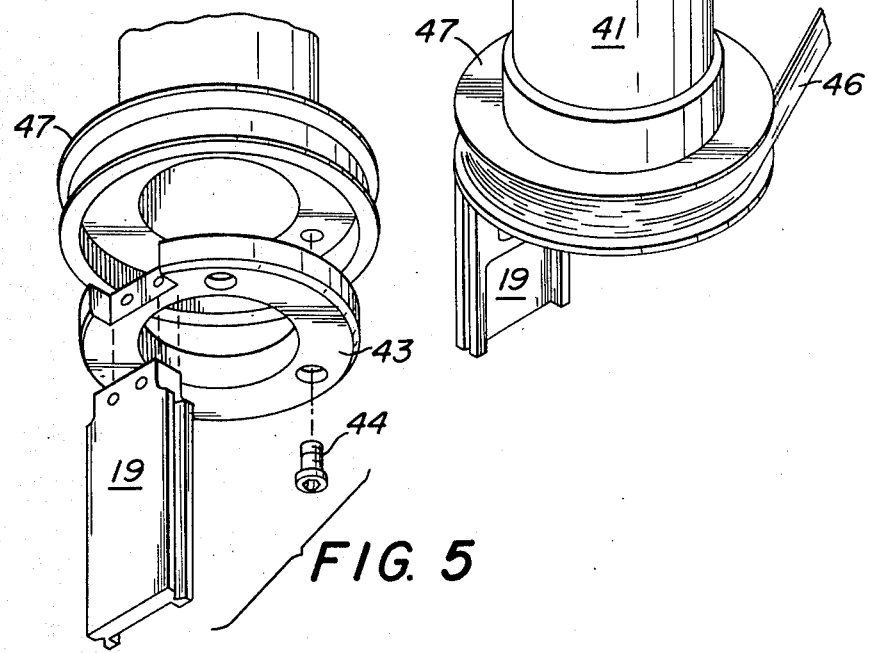
FIG. 5 is an enlarged isometric drawing showing the preferred embodiment hollow cylindrical sleeve and vertical slide for supporting the bonding tool holder.

Referring now to FIGS. 3-5 which show in greater detail the mechanism for actuating the rotational motion and the vertical motion. Rotational drive motor 14 which is mounted on mounting bracket 16 is provided with a shaft 36 and a drive gear 37. Drive gear 37 engages a cogged belt 38 which drives driven pulley gear 39. Pulley gear 39 is mounted on and comprises a part of hollow cylindrical sleeve 41. Hollow cylindrical sleeve 41 is mounted in fixed machine frame 11 for rotatable movement by bearings 42 which are biased in a vertical direction to prevent vertical backlash. Rotational movement of theta drive motor 14 imparts rotational movement to the hollow cylindrical sleeve 41, but does not impart any motion to optical support bracket 17 which is connected to and becomes part of the fixed machine frame 11. As best shown in FIGS. 4 and 5, rotational movement of hollow cylindrical sleeve 41 imparts rotational movement to adaptor ring 43 which supports slide 19. Adaptor ring 43 is connected to hollow cylindrical sleeve 41 by bolts 44 which permit the bonding head assembly 18 to be removed as a unit from hollow cylindrical sleeve 41. An electrical cable 46 having a plurality of wires is shown wrapped on wire wrap pulley 47 which connects to the bottom of hollow cylindrical sleeve 41. It will be understood that a take-up pulley (not shown) permits the rotation of hollow cylindrical sleeve 41 while the electrical cable is wrapped and unwrapped from wire wrap pulley 47. The electrical connections that connect to the solenoids and switches on bonding head assembly 18 are not shown, but are well known in this art. Connectors may be employed so that connections from cable 46 may be disconnected from the bonding head assembly 18 to permit the assembly to be removed as a unit.

It will be understood that rotational movement of the bonding head 18 slightly in excess of 360° is required for a complete operational mode of the bonding machine. Accordingly, there is provided on pulley gear 39 a stop pin 49 which is engageable with limit switch pivot arm 51. Limit switch pivot arm 51 is pivotally mounted on limit switch board 52. Shutter 53 mounted on limit switch pivot arm 51 imposes its vertically deposed shutter between photo emitters 54 and photo detectors 55 to form limit switches which interrupts the movement of theta drive motor 14. It will be understood that the stop pin 49 must overtravel the zero or 360° point to actuate limit switch arm 51 and shutter 53 in order to interrupt energization of theta drive motor 14. Accordingly, the amount of play or movement of shutter 53 can be adjusted to provide any reasonable movement in excess of 360° in either direction before the theta drive motor is deenergized.

Figure 6:
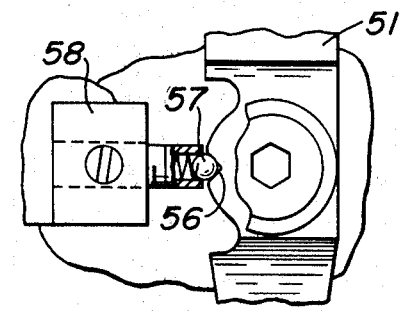
FIG. 6 is a detail showing the limit switch pivot arm for the limit switch associated with the theta drive mechanism and the detent for maintaining it in its normal position.

As shown in FIGS. 4 and 6, the limit switch pivot arm 51 is provided with a detent 56 which is engageable by a spring loaded ball 57 acting in a spring housing 58. The detent 56 is so designed that limit switch pivot arm 51 is normally engaged to return to its central position shown in FIG. 6.

Figure 8:
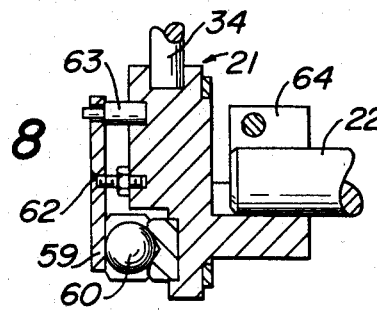
FIG. 8 is an enlarged detail and plan view taken at lines 8—8 of FIG. 7 showing the crank arm ball joint.
Figure 7:
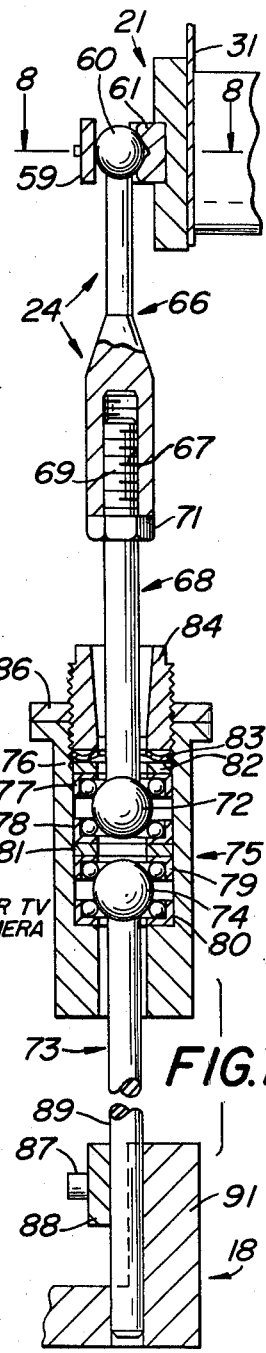
FIG. 7 is an enlarged section in elevation taken at lines 7—7 of FIG. 3 showing the universal joint coupling means.
Figure 10:
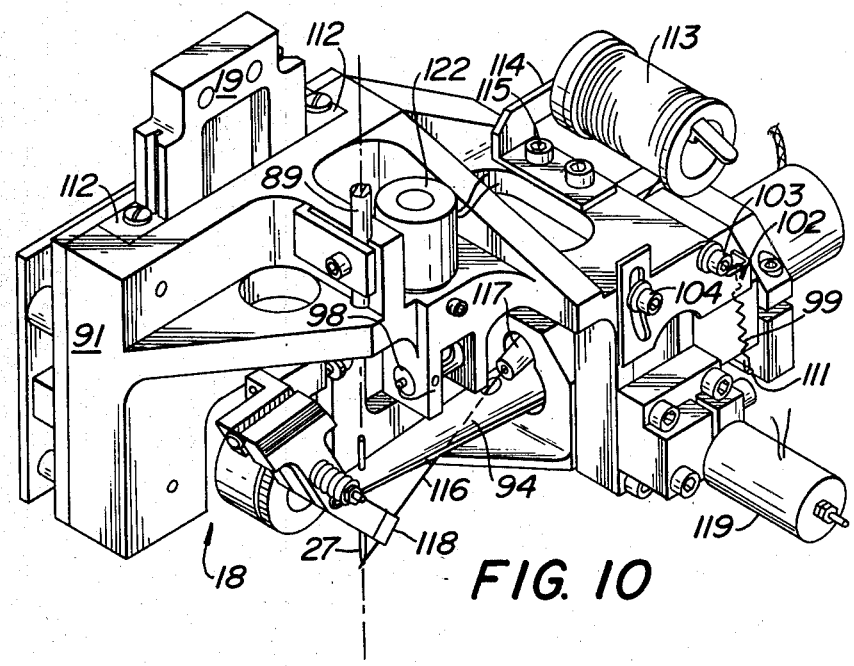
FIG. 10 is a front and side isometric view showing the bonding head mechanism mounted on the vertical slide shown in FIG. 5.
Figure 11:
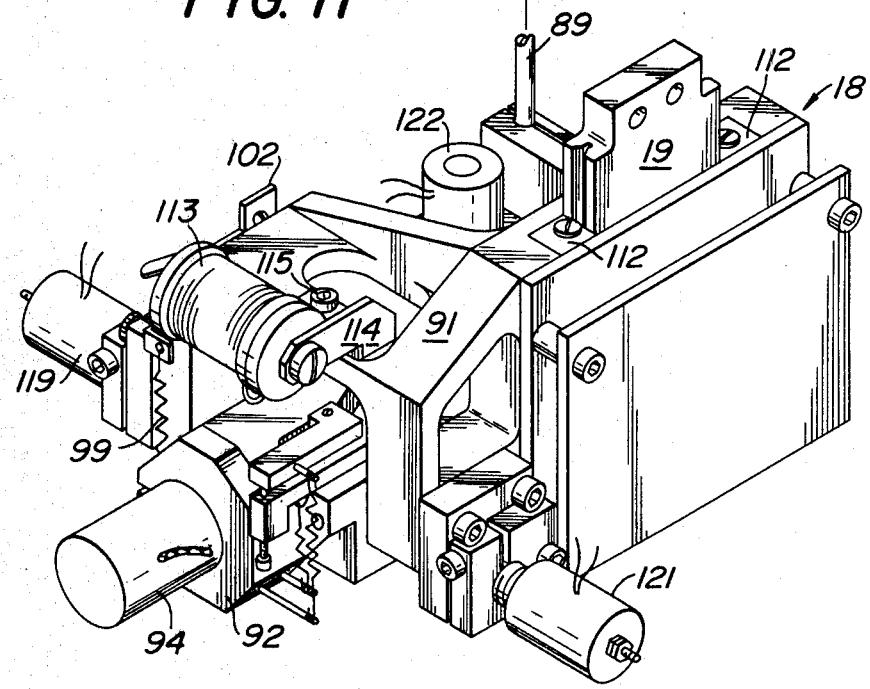
FIG. 11 is a rear and side isometric view of the bonding head mechanism showing the clamp actuating solenoid.

Referring now to FIGS. 7 and 8 showing the novel coupling means 24 linking the eccentric crank 21 shown in FIGS. 1 and 2 to the bonding head 18 shown in FIGS. 2, 10 and 11. Keeper plate 59 bears upon and retains bearing ball 60 in the socket of steel bearing socket 61. Steel socket 61 is press mounted in the eccentric crank 21 having the limit switch arm and shutter 31 mounted thereon. As best shown in FIG. 8, screw 62 is flush mounted through keeper plate 59 and screws into eccentric crank 21. Spacer pin 63 is best fitted in eccentric crank 21 and spaces the keeper plate 59 so that it properly contacts the bearing ball 60. Shaft 22 is shown mounted in the split clamp 64 which comprises a part of eccentric crank 21. Bearing ball 60 is permanently attached to bearing ball stud 66 which is provided with a female thread 67 adapted to receive the male threaded in 69 of bearing ball stud 68 having a bearing ball 72 thereon. The two bearing ball studs 66 and 68 are rigidly locked together by lock nut 71. Coupling means 24 further comprises a male bearing ball stud 73 provided with a bearing ball 74 which is fitted in the novel universal joint 75. Universal joint 75 comprises a universal bearing housing 76 in which are arranged angular contact bearings 77, 78, 79 and 80. Between the sets of contact bearings embracing the bearing balls 72 and 74 is provided a spacer washer 81. A second spacer washer 82 is provided on top of angle contact bearings 77 and provides mounting means for wavy washer 83 which is compressed and held in place by threaded male keeper 84 which is locked in place by lock nut 86.

Retaining screw 87 is mounted in a threaded recess of bonding head 18 (not shown) and retains the recessed clamp 88 in contact with the mounting rod 89 of bearing ball stud 73. It will be understood that bonding head 18 is free to rotate 360°, but is limited to exact and precise vertical movement by slide 19 coacting with the slider which forms a part of the bonding head housing to be explained hereinafter. It is virtually impossible to align the crank arm 21 in axial alignment with male bearing ball stud 73. Accordingly, bearing ball studs 66 and 68 are arranged so they are free to articulate in 360° of rotation. The crank arm 21 is preferably in a normal raised position when the crank arm extends outward at approximately 90° or 3 o'clock. When the crank arm 21 is actuated in the up or down position, bearing ball 72 is free from all backlash and transmits vertical motion to the novel universal joint 75 which imparts vertical motion to bearing ball 74 which in turn transmits exact and precise vertical motion to bonding head 18. It will be understood that once the universal joint 75 is positioned at any Z axis position that rotational movement of the bonding head will not impart any vertical motion to the bonding tool. Since the bonding tool is located at the center of rotation of the bonding head 18 which coincides with the center of rotation of universal joint 75 there is no vertical movement imparted to the bonding tool as a result of rotational movement of the bonding head 18.

As best shown in FIG. 3, clockwise movement of the eccentric crank 21 will impart downward vertical motion to the coupling means 24 which imparts downward vertical motion to the mounting rod 89 of male bearing ball stud 73. Rod 89 will impart a downward movement to housing 91 of bonding head 18 on which bonding tool holder mounting block 92 is pivotally mounted at pivot 93. Ultrasonic transducer bonding tool holder 94 is held and clamped in mounting block 92 and is provided with a bonding tool 27 mounted at the working end of the transducer 94. Continuing downward movement of the bonding head 18 will engage bonding tool 27 with a working contact surface on substrate 28 which causes the transducer 94 and mounting block 92 to pivot on pivot point 93. Lifter arm 96 is rigidly fixed to bonding tool holder 92 and articulates around pivot 93 therewith. Continuing downward movement of bonding head 18 moves bonding tool 27 down until it causes the bonding tool holder and lifter arm 96 to start a pivoting motion around pivot 93. Electrode 97 on lifter arm 96 disengages the contact 98 which is mounted on, and electrically isolated from, housing 91. Thus, it will be understood that the exact point at which bonding tool 27 begins to apply bonding force to the substrate can be sensed by the electrical disconnection between electrode 97 and contact 98. Further movement downward of bonding tool 27 assures that the bonding tool force spring 99, mounted between a pin 101 on bonding tool mounting block 92 and an adjustable spring frame 102 mounted on housing 91, and best shown in FIGS. 2 and 10, applies a spring bonding force to the bonding tool 27. The spring frame 102 pivots about screw 103 and is held in a predetermined desired position by lock screw 104. It will be understood that a predetermined downward movement of bonding head 18 will impart a similar downward movement to bonding tool 27 and is capable of applying a predetermined bonding force to the bonding tool and substrate thereunder. Semiconductor devices on substrate 28 need not be at the same height under bonding tool 27 to affect the exact same bonding force thereto. For example, the bonding head 18, and bonding tool 27 will be moved downward by coupling means 24 until the electrode 97 disengages contact 98 and this point is sensed. An exact predetermined Z movement of the bonding head 18 after the touch down point has been reached will apply the predetermined desired force to the bonding tool 27. Preferably the cylindrical recess 105 in optical support bracket 17 receives a precision press fitted bearing 85 in which universal joint housing 75 slides and/or rotates without slack or loose movement.

Figure 9:
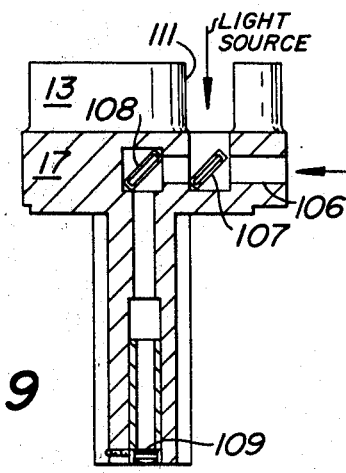
FIG. 9 is an enlarged section in elevation taken at lines 9—9 of FIG. 2 showing the viewing means only in the optical support bracket with other elements of the section view being omitted.

Referring now to FIGS. 2, 3 and 9, showing the center line for mounting the T.V. camera. The optical axis path of the T.V. camera enters into a side aperture 106 in optical support bracket 17 and preceeds through a beam splitting mirror 107 and is reflected by a first surface mirror 108 to an objective lens system 109 which is mounted approximately $\frac{3}{8}''$ to the right of the center of rotation of the hollow cylindrical sleeve as best shown in FIGS. 2 and 3. The Z motor mounting bracket 13 is provided with an aperture 111 for mounting a light source (not shown) which is reflected into the optical axis of the T.V. camera by the beam splitting mirror 107.

Referring now to FIGS. 10 and 11 showing isometric views of bonding head 18 mounted on slide 19. It will be understood that slide 19 is mounted on the aforementioned hollow cylindrical sleeve 41 and that bonding head 18 is movable in a vertical direction by mounting rod 89 of coupling means 24. Slide 19 is mounted in a bearing slider 112 forming a part of housing 91. Such vertical sliders are well known in this art and need not be explained in detail herein. The wire to be bonded to the semiconductor device or electrode of the semiconductor device is supplied by spool 113 which is rotatably mounted on spool bracket 114 mounted on housing 91 by screws 115. The wire 116 is led from the spool through a guide funnel 117 and extends through the ultrasonic transducer 94 where it is threaded into the guide openings in wedge bonding tool 27.

After a wire bond is made at the first and second bond positions, the wire 116 must be broken and rethreaded in bonding tool 27. Wire clamp 118 is normally closed on wire 116 and is adapted to apply a force in the direction of the wire spool 113 to cause the wire 116 to break at the edge of the working face of the bonding tool 27 as is known in the bonding art. Wire clamp 118 may then be pivoted away from the spool 113 to force the wire 116 back into the apertures in bonding tool 27 and under the working face of the bonding tool. Once the wire 116 is under the working face of the bonding tool 27 and the bond is completed, wire clamp 118 may be opened and rocked back to its normal position and reclamped leaving the wire 116 in a position for the next bond. Wire feed clamp solenoid 119 is provided for actuating the clamping motion of clamp 118. Wire feed clamp solenoid 121 provides the rocking motion for wire clamp 118. The manner in which the solenoids mechanically actuate the rocking and clamping motion of wire clamp 118 constitutes a separate invention and are not explained in detail herein. Wire clamps are well known in the prior art which are capable of clamping and rocking motions for wedge bonding tools. A damper solenoid 122 is provided to hold electrode 97 in contact with contact 98 during rapid vertical movement of the bonding head 18. It will be understood that damper solenoid 122 is deenergized and removed from active position shortly before the bonding operation takes place so that the bonding force applied to bonding tool 27 is applied by bonding spring 99.

Figure 12:
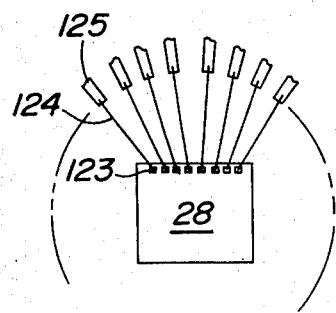
FIG. 12 is a plan view of a semiconductor device showing wires connected between the electrodes on the semiconductor device and the lead connections on a substrate or printed circuit.
Figure 13:
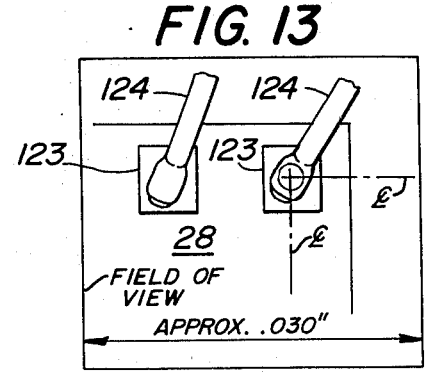
FIG. 13 is an enlarged view of the wires bonded to the electrodes of the semiconductor device shown in FIG. 12.

Referring to FIG. 12 showing a substrate 28 which has been wired bonded to connect pads or targets 123 on substrate 28 to lead out terminals 125 with wires 124. FIG. 13 shows an enlarged view of two of the pads 123 to which wires 124 have been attached and mashed out by bonding tool 27. It will be understood that substrate 28 may be in the form of a miniturized printed circuit, a hybrid integrated circuit or a ceramic substrate on which devices have been mounted.

Figure 14:
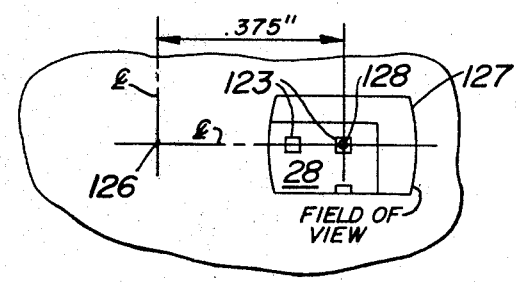
FIG. 14 is a schematic view showing the location of the field of view relative to the semiconductor device of FIGS. 12 and 13 before wires are attached to the electrodes.

Referring now to FIGS. 3, 10, 14 and 15, it can be seen that the T.V. camera cannot view vertically downward so as to observe the tip of the bonding tool 27. The central axis of rotation 126 is aligned with the center of rotation of cylinder sleeve 41, mounting rod 89 and the approximate tip of the bonding tool 27. The objective lens system 109 is displaced to the right of the working face of the bonding tool 27 by approximately $\frac{3}{8}''$ so that the field of view 127 is displaced to the right approximately $\frac{3}{8}''$ as shown in FIG. 14 during the bonding operation. In order to align the terminals or pads 123 with the working face of the bonding tool, the substrate 28 is shifted to the right under the field of view 127 which is provided with a cross hair target 128 therein. Once the pad 123 is aligned with the cross hair 128, the displacement of the X-Y table 29 by the correct predetermined amount will always align the bonding tool 27 with the target or pad 123 once it is aligned with the cross hair 128.

If the bonding tool 27 and bonding tool head 18 were always moved in only an exact X axis and Y axis relative to the X-Y table, a simple X-Y adjustment could be made to always center the bonding tool 27 with the center of rotation of the hollow cylindrical sleeve 41. However, this has not been possible because minor adjustments and/or replacement of bonding tools always causes the working face of the bonding tool to assume a position slightly eccentric from the center of rotation of the hollow cylindrical sleeve 15. The bonding head and the control mechanism for operating the bonding head have been employed in a teaching mode which will always locate the exact center of rotation of any bonding tool even though it be slightly off center from the center of rotation.

Figure 15:
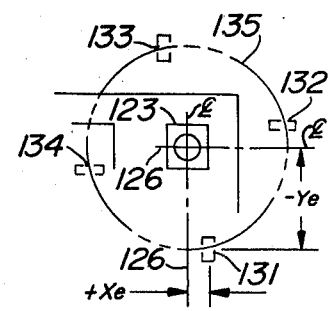
FIG. 15 is an enlarged view of the field of view showing the semiconductor device shifted to a viewing position in alignment with the field of view shown in FIGS. 13 and 14.

Referring now to FIG. 15 showing in schematic form a pad or electrode 123 located at the exact center of rotation of the hollow cylindrical sleeve 41. Assume for purposes of this explanation that the bonding tool 27 is first engaged with the substrate and leaves a mark 131 which is displaced from the center of rotation of the hollow cylindrical sleeve shown at the center of pad 123 by an error in the X direction of $+X_e$ and further that the point where the bonding tool engages the substrate was displaced from the center of rotation in the $-Y$ direction by $-Y_e$. Assume further that the bonding head 18 is sequentially rotated 90° and the bonding tool is engaged with the substrate to leave the marks on the substrate 132, 133 and 134. Since the center of rotation of the hollow cylindrical sleeve is an exact position relative to the working face of the bonding tool 27 shown by marks 131–134. the displacement from the center of rotation is always the same magnitude $X_e$ and $Y_e$, but in a different polar coordinate direction. Any three of the points 131 to 134 may be employed to locate the center of rotation 126 by taking the perpendicular bisectors of the chords on the error circle 135. This error information concerning the polar coordinate position of the bonding head 18 and the $X_e$ and $Y_e$ error magnitudes may be placed in a look up table in a computer memory or a simple routine program may be developed so that any rotational position of the bonding head will produce the actual X error and Y error to be incorporated into the X-Y table to place the center of rotation 126 directly beneath the working face of the bonding tool illustrated by the marks 131 to 134 of the working face of bonding tool 27. Having explained how the $X_e$ and $Y_e$ displacement errors may be manually calculated, it is understood that a computer is capable of carrying out this error computation instanteously. The correction error in the X and Y direction is fed into the servo motors which position the X-Y table 29 as well as the offset of the field of view 127 of the television camera (not shown).

For every polar coordinate position during a bonding operation there is a unique $X_e$ and $Y_e$ magnitude to be incorporated into the X-Y table 29 to bring the bonding tool 27 back to the center of rotation 126. While the diameter of the error circle 135 does not change, the $X_e$ and $Y_e$ magnitudes are unique for each polar coordinate in the 360° of rotation of bonding head 18.

Figure 16:
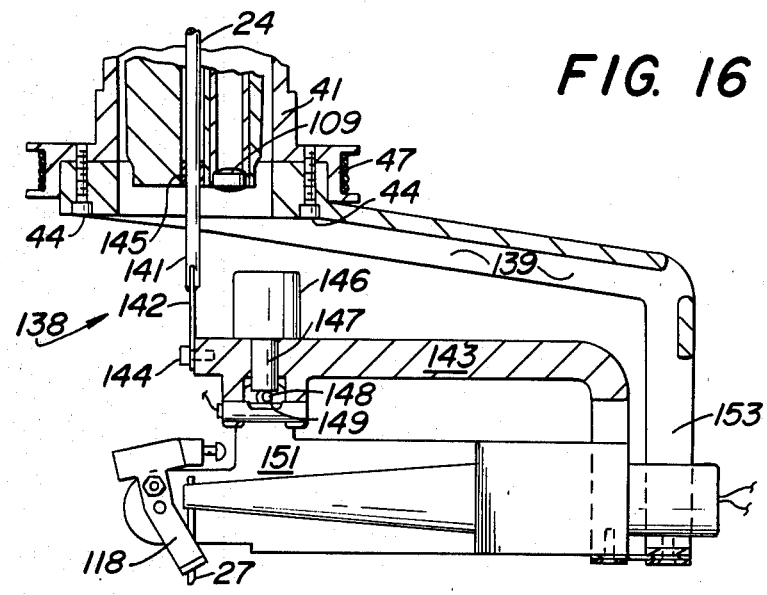
FIG. 16 is a side view in partial section of a modified embodiment wedge bonding head.
Figure 17:
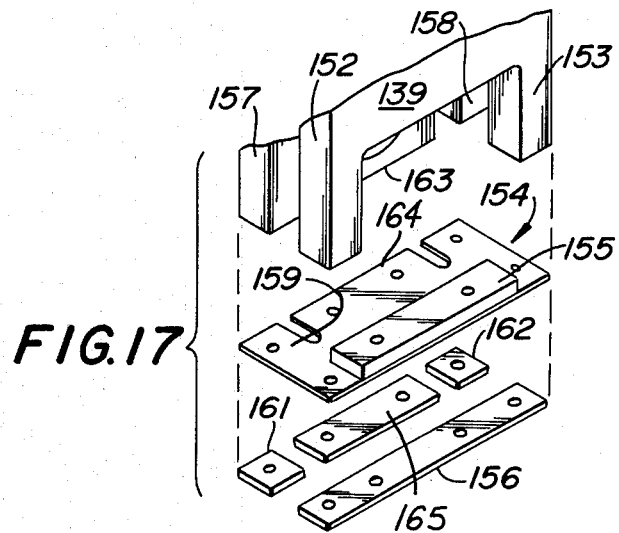
FIG. 17 is an exploded isometric view showing the pivot spring and plates for pivotally mounting the bonding tool holder and lifter arm.

Having explained a preferred embodiment head 18, refer now to FIGS. 16 and 17 showing a modified embodiment bonding head 138. Bonding head housing 139 is rigidly connected to hollow cylindrical sleeve 41 by screws 44 as explained hereinbefore. The portion of the wire bonding machine above housing 139 is substantially identical to that described hereinbefore. Since the bonding head 138 is not mounted on a slider, the vertical movement of the bonding tool 27 is limited to the pivoting movement shown which is substantially vertical. Most flat semiconductor devices may be wire bonded with the substantial vertical movement provided with pivoted type bonding heads.

Coupling means 24 in this embodiment is provided with a mounting rod 141 connected to a flexible plate 142 which is welded in a slot at the end of the mounting rod 141. Plate 142 is attached to pivotable lifter arm 143 by a lock screw 144. Downward vertical movement of rod 141 is guided in bearing 145 and urges lifter arm 143 downward. Damper and bonding force solenoid 146 is mounted on lifter arm 143 and its solenoid plunger 147 engages electrode 148 against electrical contact 149 which is mounted on bonding tool mounting block 151. Downward movement of rod 141 imparts downward movement to bonding tool 127 and a bonding force is preferably applied by bonding force solenoid 146.

Wire clamp 118 has been explained hereinbefore and may be identical to that already described.

Downward extending arms 152, 153 of housing 139 are attached to the rear of E-shaped pivot spring 154 by screws (not shown). Stiffening plates 155 and 156 are attached on opposite sides of spring 154 at the rear portion to rigidify the rear portion of spring 154 which is attached to arms 152, 153 as best shown in FIG. 17.

Outer legs 157, 158 of lifter arm 143 are attached to the outer pivotable portion 159 of pivot spring 154 by stiffening plates 161, 162 and by screws (not shown).

Bonding tool mounting block 151 is provided with a mounting flange 163 which is attached to the central pivotal portion 164 of pivot spring 154 by a stiffening plate 165 and screws (not shown).

It will be understood that lifter arm 143 and bonding tool mounting block 151 are independently pivoted on the front portion of spring 154 so that the transducer 94 holding bonding tool 27 may be engaged with the substrate or semiconductor device under control of the Z-drive motor 12.

Having explained a preferred embodiment and a modified embodiment it will be understood that the bonding heads 18 and 138 are mounted on a hollow cylindrical sleeve to permit rotational motion in excess of 360° and that rotational movement of the bonding head 18 or 138 does not impart any vertical movement to the coupling means 24 which operate independently thereof.

What is claimed is:

1. A method of aligning the working face of a bonding tool with a bonding target of a substrate located on a X-Y table for movement perpendicular to the axis of rotation of a rotatable bonding head comprising the steps of:
    mounting said bonding tool on said rotatable bonding head having the working face of the bonding tool oriented near the axis of rotation of said head,
    rotating said bonding tool to at least three distinct rotational positions,
    marking the position of said working face on said bonding tool by engaging said bonding tool with a substrate at said distinct rotational positions,
    calculating the error displacement of said working face of said bonding tool from the true center of rotation of said hollow cylindrical sleeve, and
    positioning said X-Y table by an amount sufficient to locate said bonding target of said substrate with said center of rotation and further by an amount equal to said error displacement to compensate for the calculated error displacement of the working face of said bonding tool from the actual center of rotation of said bonding head prior to bonding on said bonding target.

2. A method of aligning the working face of a bonding tool as set forth in claim 1 which further includes the steps of:
    offsetting said X-Y table a predetermined amount from the center of rotation of said bonding head to permit viewing the area of said substrate to be bonded for aligning said bonding target with a point of said bonding head offset by said predetermined amount, and
    positioning said X-Y table by an additional amount equal to the sum of said error displacement and said predetermined offset.

3. A method of aligning the working face of a bonding tool with a bonding target on a workpiece comprising the steps of:
    mounting a substrate on a support for relative rotation with respect to a bonding head which supports a bonding tool with its working face oriented near the axis of said relative rotation;
    rotating the substrate relative to said working face of said bonding tool about said axis to at least three distinct rotational positions;
    marking the position of said working face of said bonding tool relative to said substrate by engaging said bonding tool with said substrate at said distinct positions;

calculating the error displacement of said working face of said bonding tool from said axis;

supporting said workpiece on an X-Y table for movement in a plane perpendicular to said axis, and shifting said X-Y table to relatively locate said bonding target with respect to said axis; and further positioning said X-Y table by an amount equal to said error displacement to compensate for said calculated error displacement.

* * * * *